United States Patent [19]
Miyanishi et al.

[11] Patent Number: 5,210,933
[45] Date of Patent: May 18, 1993

[54] CIRCUIT ASSEMBLY ROBOT
[75] Inventors: Shuichi Miyanishi; Eiki Nakatani, both of Komatsu, Japan
[73] Assignee: Komatsu Giken Co., Ltd., Ishikawa, Japan
[21] Appl. No.: 778,251
[22] Filed: Oct. 17, 1991
[30] Foreign Application Priority Data
Oct. 30, 1990 [JP] Japan .............................. 2-113889[U]
[51] Int. Cl.⁵ ............................................. H05K 3/30
[52] U.S. Cl. ........................................ 29/741; 29/759
[58] Field of Search .................................. 29/739–741, 29/759, 837–839

[56] References Cited
U.S. PATENT DOCUMENTS 4,205,433  6/1980  Araki et al. ...................... 29/741 X
4,745,679  5/1988  Shinano et al. ...................... 29/741
4,763,701  8/1988  Whitley .
4,817,272  4/1989  Campisi et al. .

FOREIGN PATENT DOCUMENTS 0230870  8/1987  European Pat. Off. .
2120583  12/1983  United Kingdom .
2131331  6/1984  United Kingdom .

Primary Examiner—Carl E. Hall
Attorney, Agent, or Firm—Kane, Dalsimer, Sullivan, Kurucz, Levy, Eisele and Richard

[57] ABSTRACT

A circuit assembly robot has one component grasping mechanism, whereby it is possible to reduce manufacturing costs and increase the ease of manufacture in comparison with the prior art. The component grasping mechanism is pivotable in a vertical plane, whereby it is possible to decrease operation time.

13 Claims, 2 Drawing Sheets

CIRCUIT ASSEMBLY ROBOT

BACKGROUND OF THE INVENTION

1. Field of the Invention

The present invention relates to devices used in the assembly of electronic circuit boards, and particularly, to automated devices for mounting electronic components on printed circuit boards.

2. Prior Art

Robots for automated mounting of electronic components on printed circuit boards are conventionally known. Components to be mounted are generally manipulated using multiple grasping mechanisms, for example, one for transistors, one for integrated circuits, one for resistors, etc., with movement of each grasping mechanism controllable in three dimensions through operation of a separate driving mechanism for the x-axis, y-axis and z-axis for each grasping mechanism. Most commonly, components are supplied to a predetermined location in proximity to the board under assembly, and through use of a control program which supplies Cartesian coordinate data along with other control data, the various grasping mechanisms move sequentially between the component supply point and an appropriate location on the circuit board where the currently grasped component is then seated.

After a component is thus seated on the circuit board with each lead passing through a respective lead hole, a mounting mechanism bends each lead at a point after it passes through the lead hole so as to prevent the component from falling out prior to soldering. As with the grasping mechanisms, different mounting mechanisms are used for the various different types of components, and each is controllable in three dimensions based on Cartesian coordinate control data. Thus, the robot must control and coordinate multiple grasping mechanisms and mounting mechanisms.

Conventional robots for automated circuit assembly as thus described have the following limitations:

(1) At each station on an assembly line where such a robot is employed, generally the robot at each station is the same. In other words, every robot must be capable of handling every type of component, and capable of mounting nearly any number of components at a given station. Thus, for example, the robot used at a station where one resistor is mounted is the same kind of robot at stations where multiple different components are mounted. For this reason, quite commonly, a very expensive, multifunctional robot is used at a station where only limited assembly is required, which is decidedly uneconomical.

(2) Control of multiple grasping and mounting mechanisms in three dimensions is exceedingly complicated. Thus, unless very expensive high speed computational devices are used for control, control data is supplied at a low rate and assembly is therefore time consuming.

SUMMARY OF THE INVENTION

In consideration of the above, it is an object of the present invention to provide a circuit assembly robot which can rapidly and economically mount components on a circuit board.

So as to satisfy this object, the present invention provides a robot for automated assembly of electronic circuits on a circuit board supplied to a predetermined assembly space defined relative to the robot by means of a circuit board conveyor system, the robot comprising:

a) a base;

b) a frame mounted over at least two sets of guide rails mounted on the base, whereby the frame is movable relative to the base in two dimensions in a horizontal plane;

c) component supplying device mounted on the frame for storing electronic components which are to be mounted on the printed circuit board, and supplying the electronic components to the predefined assembly space;

d) component manipulating device mounted on the frame including at least one component grasping mechanism for grasping electronic components supplied to the assembly space by the component supplying device, such that a component grasping portion of the component grasping mechanism is pivotable in a vertical plane within the assembly space about a predetermined axis, and capable of receiving an electrical component from the component supplying device and seating the component on the circuit board so that each lead of the component passes through a respective component lead mounting hole in the circuit board; and e) at least one component lead securing device mounted at a fixed position on the frame such that the component lead securing device moves in concert with the component manipulating device and such that the component lead securing device is in a position substantially vertically aligned with the component grasping mechanism of the component manipulating device when the component grasping mechanism seats a component on the circuit board, the fixed position lying below the horizontal plane in which a printed circuit board supplied to the robot lies, the component lead securing device capable of bending leads of an electrical component at a point on each lead distal to a point at which the lead exits from a corresponding component lead mounting hole in the circuit board.

The other objects and features of this invention will become understood frame the following description with reference to the accompanying drawings.

DETAILED DESCRIPTION OF THE PREFERRED EMBODIMENTS

Figure 1:
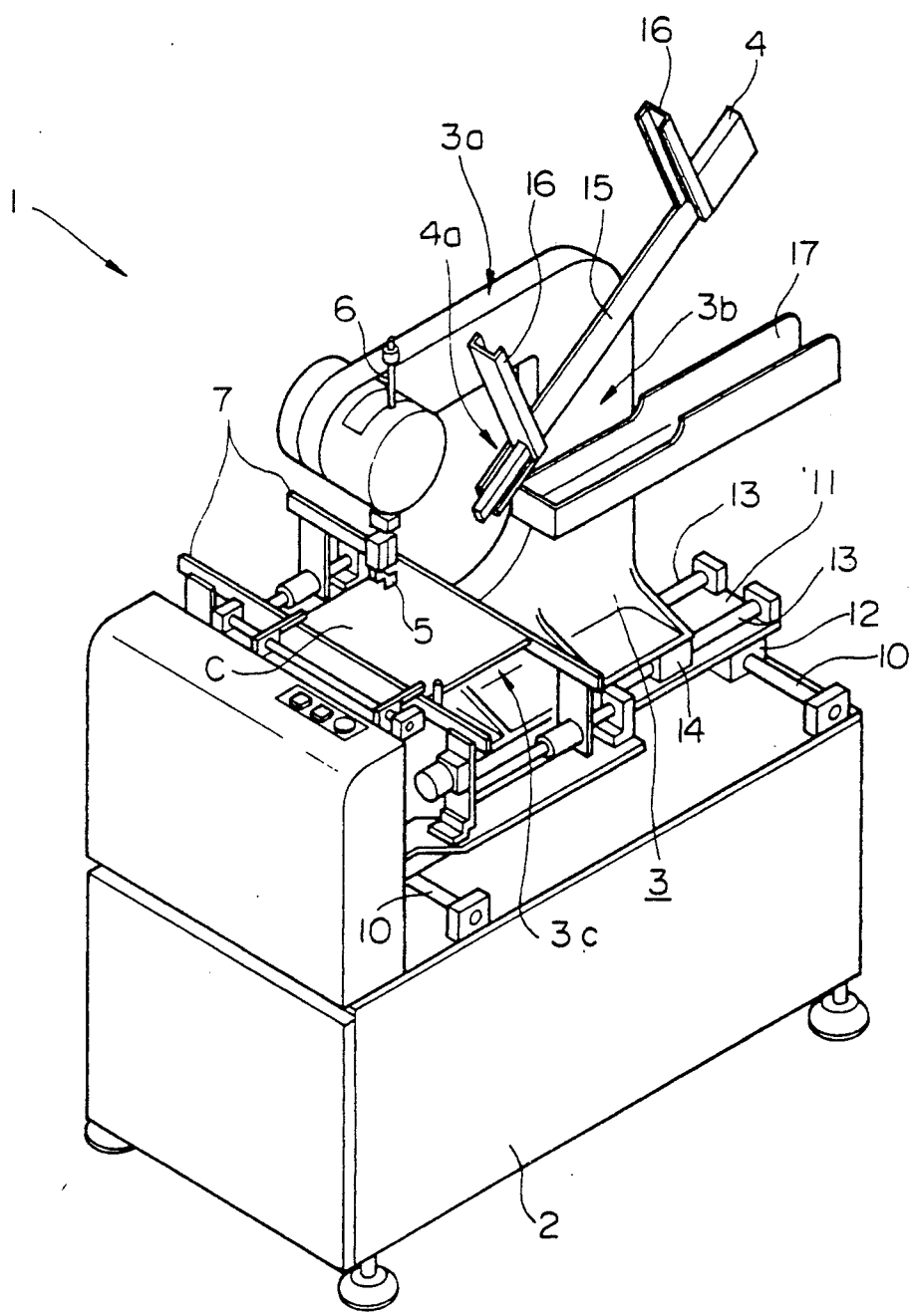
FIG. 1 is a perspective view of a circuit assembly robot.
Figure 2:
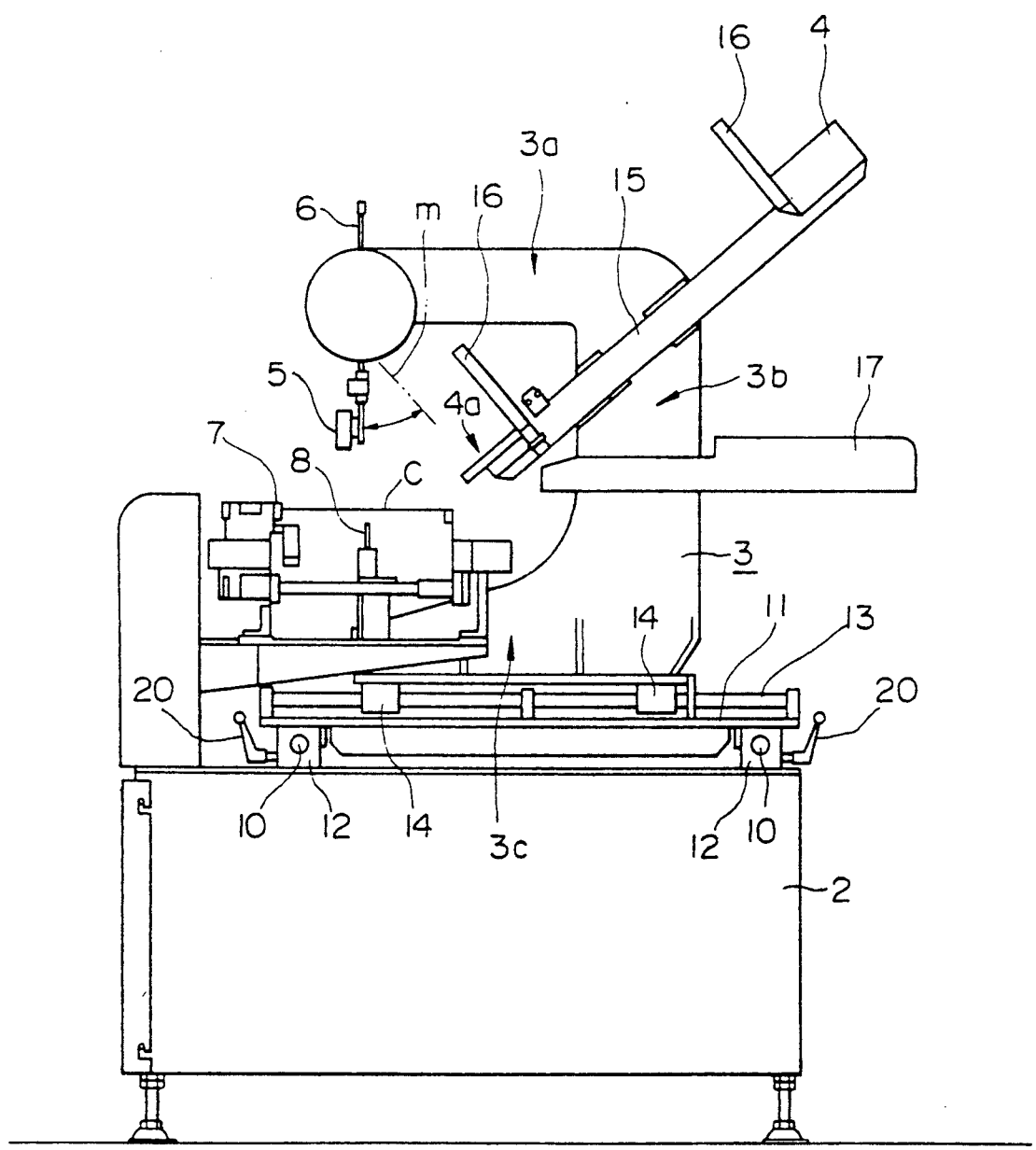
FIG. 2 is a side view of the circuit assembly robot.

With reference to FIGS. 1 and 2, preferred embodiments of the present invention will be described in detail in the following. In the following description, materials, structures, and interrelation of the structural elements are merely a descriptive example, and not intended to limit the scope of the invention.

FIG. 1 shows a robot 1 for automated assembly of electronic circuits on circuit boards supplied thereto. The robot 1 includes a base 2, a frame 3 mounted on base 2, component supplying mechanism 4 for storing and supplying the electric components to be installed on a circuit board, a single manipulator 6 having a component grasping device 5, a single component lead securing device 8 facing the manipulator 6 and a pair of rails 7, 7 located between manipulator 6 and component lead securing device 8.

The frame 3 is mounted over at least two sets of guide rods 13, 13 mounted on base 2, whereby the frame 3 is movable relative to the base 2 in two dimensions in a horizontal plane. As seen in FIG. 2, when viewed from the side, frame 3 is shaped substantially in the form the letter C. The concavity formed by the letter C formation faces rails 7, 7.

The component grasping device 5 is pivotable between a component supplying portion 4a of the component supplying mechanism 4 and a position in proximity to a point on the circuit board at which a component is to be installed.

Two guide rods 10, 10 are provided on the base 2, parallel to rails 7, 7. A sliding base 11 is provided on these rods 10,10 so as to be able to slide therealong. That is, blocks 12, 12 which engage rods 10, 10 are provided on the lower face of the sliding base 11, forming a gliding articulation therewith, whereby sliding base 11 is able to slide over rails 7, 7 along an axis which is parallel with rails 7, 7. As shown FIG. 2, locking levers 20, 20 are provided for fixing the blocks 12, 12 to guide rods 10, thereby immobilizing sliding base 11.

On the upper surface of sliding base 11, second guide rods 13, 13 are provided in a mutually parallel orientation, and perpendicular to guide rods 10, 10. Blocks 14, 14 which are provided on the lower surface of frame 3 slidably engage second guide rods 13, 13. In this way, frame 3 is able to move along an axis parallel to second guide rods 13, 13 and perpendicular to guide rods 10, 10.

The components supplying portion 4a is provided on vertical portion 3b of frame 3. Components supplying mechanism 4 typically receives components in elongated preloaded cassettes. A pair of guides 16, 16 project above a cassette holder 15 at right angles therewith. The above mentioned cassettes are placed in cassette holder 15 between guides 16, 16. A tray 17 is provided below for catching empty cassettes.

Manipulator 6 is provided at the end of upper horizontal portion 3a of frame 3. This manipulator 6 pivots over a predetermined angle about an axis which is parallel to rails 7, 7 driven by an air cylinder. In this way, component grasping device 5 of manipulator 6 can swing between a position in which it is vertically aligned over circuit board C and a position in proximity to cassette holder 15 of the component supplying mechanism 4, as indicated by the broken line in FIG. 2. Furthermore, the grasping mechanism of component grasping device 5 expands to release and contracts to grasp a component through the operation of an air cylinder (not shown) of manipulator 6.

The component lead securing device 8 is provided on the upper surface of the lower horizontal portion 3c of the frame 3. This component lead securing device 8 is provided so as to directly oppose component grasping device 5 when it is in the vertically aligned position as shown in FIG. 2.

In the following, operation of the robot 1 is described.

First of all, adjusting the position of slide base 11 and frame 3 along guide rods 10, 10 and second guide rods 13, 13, the circuit board C is brought into a position such that the point thereon at which a component is to be installed is located between vertically aligned manipulator 6 and component lead securing device 8. When this is carried out manually, after the desired position is reached, the operator then fixes that position through operation of locking levers 20, 20.

After the component to be mounted is received from component supplying mechanism 4 by grasping device 5 of manipulator 6, grasping device 5 then closes, thus grasping the component. Manipulator 6 then rotates away from the position shown by the broken line to assume a vertical orientation, whereby the component grasped by grasping device 5 comes to be held directly over the position on circuit board C where it is to be mounted, with the lower surface of the component facing the circuit board.

With the component to be mounted thus held over circuit board C, due to the earlier positioning operation, the component leads will be aligned over the appropriate hole for each lead. In this position, grasping device 5 extends, thereby seating the component on the circuit board with the leads thereof passing through each corresponding lead hole. As previously described, the component thus seated directly overlies lead securing device 8 which is then activated, thereby bending each lead at the point where it exits circuit board C, in this way securing the component to the board.

In manufacturing situations where multiple robots 1 are employed, each robot installing a single component on a circuit board C, once the component has been mounted by the robot presently under description, circuit board C is then transferred over rails 7, 7 to the next robot, and another circuit board C is transferred to robot 1, after which the above described assembly operation is repeated.

In contrast, if a different component is to be mounted at another position, then the board is repositioned, after which the assembly cycle is then repeated.

The robot 1 of the present invention as thus described provides the following advantages:

1. The position of circuit board C can be easily by hand, thereby permitting rapid and reproducible positioning of each board for component installation.

2. Since the component lead securing device 8 has a fixed position on frame 3 relative to manipulator 6, circuit board C need be positioned only once. For the same reason, once a component is seated on circuit board C, it can be secured thereto rapidly and reliably through operation of component lead securing device 8.

3. When multiple identically formed components are to be mounted, only the position of circuit board C relative to frame 3 need be changed. Likewise, since the operation of grasping device 5 and manipulator 6 does not change, no change is necessary for the control program.

4. When operation of manipulator 6 is limited to pivoting between two positions, control thereof is simplified and the efficiency of the assembly process is significantly enhanced.

What is claimed is:

1. A robot for automated assembly of electronic circuits on a circuit board supplied to a predetermined assembly space defined relative to said robot by means of a circuit board conveyor system, said robot comprising:
 a) a base;
 b) a frame mounted over at least two sets of guide rails mounted on said base, whereby said frame is movable relative to said base in two dimensions in a horizontal plane;

c) at least one component supplying device mounted on said frame for storing electronic components which are to be mounted on said printed circuit board, and supplying said electronic components to said predefined assembly space;

d) component manipulating device mounted on said frame including at least one component grasping mechanism for grasping electronic components supplied to said assembly space by said component supplying device, said at least one component grasping mechanism corresponding to said at least one component supplying device respectively, such that a component grasping portion of said component grasping mechanism is pivotable in a vertical plane within said assembly space about a predetermined axis, and capable of receiving an electrical component from said component supplying device and seating said component on circuit board so that each lead of said component passes through a respective component lead mounting hole in said circuit board; and e) at least one component lead securing device mounted at a fixed position on said frame such that said component lead securing device moves in concert with said component manipulating device and such that said component lead securing device is in a position substantially vertically aligned with said component grasping mechanism of said component manipulating device when said component grasping mechanism seats a component on said circuit board, said fixed position lying below said horizontal plane in which a printed circuit board supplied to said robot lies, said component lead securing device capable of bending leads of an electrical component at a point on each lead distal to a point at which said lead exits from a corresponding component lead mounting hole in said circuit board.

2. A robot in accordance with claim 1 above, wherein said component grasping mechanism is pivotable over a predetermined angle in said vertical plane.

3. A robot in accordance with claim 2 above, wherein said extreme positions of said predetermined angle are defined such that said component grasping mechanism is pivotable between a first position wherein said component grasping mechanism is in proximity to a position at which said component supplying device supplies electronic components to said predefined assembly space and a second position in proximity to said position whereat an electric component is seated on said printed circuit board.

4. A robot in accordance with claim 1 above, wherein said component grasping mechanism is extendable and retractable along a axis which lies in said vertical plane and which intersects said axis about which said component grasping mechanism pivots.

5. A robot in accordance with claim 1 above, wherein said frame includes a position controlling device whereby movement of said frame in said horizontal plane is controlled.

6. A robot in accordance with claim 5 above, wherein said position controlling device is manually controlled.

7. A robot in accordance with claim 5 above, wherein said position controlling device is automatically controlled based on an externally supplied control signal.

8. A robot in accordance with claim 5 above, said robot further comprising a frame position controlling circuit for generating a control circuit whereby said position controlling device is automatically controlled.

9. A robot in accordance with claim 8 above, said robot further comprising a position sensor whereby a position of said frame in said horizontal plane relative to said circuit board can be detected, and which generates and supplies a position signal to said controlling circuit.

10. A robot in accordance with claim 1 above, wherein said component grasping mechanism is mounted on a vertical extension of said frame, whereby said position of said component lead fixing device relative to said component grasping mechanism is fixed.

11. A robot in accordance with claim 10 above, wherein said frame and said vertical extension of said frame are formed such that when viewed from a side thereof, said frame and said vertical extension thereof are formed in a C-shape.

12. A robot for automated assembly of electronic circuits on a circuit board supplied to a predetermined assembly space defined relative to said robot by means of a circuit board conveyor system, said robot comprising:

a) a base;

b) a frame mounted over at least two sets of guide rails mounted on said base, whereby said frame is movable relative to said base in two dimensions in a horizontal plane;

c) at least one component supplying device mounted on said frame for storing electronic components which are to be mounted on said printed circuit board, and supplying said electronic components to said predefined assembly space, said component supplying device being a preloaded cassette supplying type and having a component supplying portion at a low end of a cassette holder of said component supplying device;

d) component manipulating device mounted on said frame including at least one component grasping mechanism for grasping electronic components supplied to said assembly space by said component supplying device, said at least one component grasping mechanism corresponding to said at least one component supplying portion of said component supplying device respectively, such that a component grasping portion of said component grasping mechanism is pivotable in a vertical plane within said assembly space about a predetermined axis, and capable of receiving an electrical component from said component supplying device and seating said component on said circuit board so that each lead of said component passes through a respective component lead mounting hole in said circuit board; and e) at least one component lead securing device, said component lead securing device, component manipulating device and component supplying device being fixed relative to each other while a component is mounted on said circuit and board such that said component lead securing device moves in concert with said component manipulating device and such that said component lead securing device is in a position substantially vertically aligned with said component grasping mechanism on said component manipulating device when said component grasping mechanism seats a component on said circuit board, said fixed position lying below said horizontal plane in which a printed circuit board supplied to said robot lies, said component lead securing device capable of bending leads of an electrical component at a point on each lead distal to a point at which said lead exits from a corresponding component lead mounted hole in said circuit board.

13. A robot in accordance with claim 12 above, wherein one each of said component supplying device, said component grasping mechanism, and said component lead securing device is provided on the frame.

* * * * *